(12) United States Patent
Gambino et al.

(10) Patent No.: US 8,679,863 B2
(45) Date of Patent: Mar. 25, 2014

(54) FINE TUNING HIGHLY RESISTIVE SUBSTRATE RESISTIVITY AND STRUCTURES THEREOF

(75) Inventors: Jeffrey P. Gambino, Westford, VT (US); Derrick Liu, Winooski, VT (US); Dale W. Martin, Hyde Park, VT (US); Gerd Pfeiffer, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/420,637

(22) Filed: Mar. 15, 2012

(65) Prior Publication Data

US 2013/0244348 A1 Sep. 19, 2013

(51) Int. Cl.
*H01L 21/00* (2006.01)

(52) U.S. Cl.
USPC ............... 438/10; 438/3; 257/E21.002

(58) Field of Classification Search
USPC ................................. 438/663, 3, 10
See application file for complete search history.

(56) References Cited

U.S. PATENT DOCUMENTS

| | | | | |
|---|---|---|---|---|
| 3,765,940 | A * | 10/1973 | Hentzschel | 438/385 |
| 4,691,223 | A | 9/1987 | Murakami et al. | |
| 4,819,040 | A | 4/1989 | Tobin | |
| 5,086,332 | A | 2/1992 | Nakagawa et al. | |
| 5,637,908 | A | 6/1997 | Lowther et al. | |
| 6,165,884 | A * | 12/2000 | Lee et al. | 438/592 |
| 6,255,185 | B1 * | 7/2001 | Coolbaugh et al. | 438/382 |
| 6,289,257 | B1 * | 9/2001 | Sekine | 700/121 |
| 6,410,430 | B1 | 6/2002 | Lee et al. | |
| 6,472,232 | B1 * | 10/2002 | Johnson et al. | 438/14 |
| 6,602,724 | B2 * | 8/2003 | Redeker et al. | 438/5 |
| 6,638,629 | B2 * | 10/2003 | Johnson et al. | 428/446 |
| 6,856,849 | B2 * | 2/2005 | Riley et al. | 700/121 |
| 6,960,774 | B2 * | 11/2005 | Coss et al. | 250/492.21 |
| 7,018,597 | B2 * | 3/2006 | Ellison et al. | 423/345 |
| 7,135,423 | B2 | 11/2006 | Downey | |
| 7,220,990 | B2 * | 5/2007 | Aghababazadeh et al. | 257/48 |
| 7,749,778 | B2 * | 7/2010 | Chanda et al. | 438/17 |
| 7,751,908 | B2 * | 7/2010 | Chang et al. | 700/29 |
| 7,883,990 | B2 | 2/2011 | Levy et al. | |
| 2003/0199112 | A1 * | 10/2003 | Shanmugasundram et al. | 438/17 |
| 2007/0236232 | A1 * | 10/2007 | Aghababazadeh et al. | 324/751 |
| 2010/0304509 | A1 * | 12/2010 | Aghababazadeh et al. | 438/17 |

FOREIGN PATENT DOCUMENTS

WO WO 04001850 12/2003

OTHER PUBLICATIONS

"Why Higher Resistivity Wafers?", http://www.memc.com/assets/file/products/advanced-materials/hi-low%20res_rev10102003.pdf, 5 pages, provided on Sep. 14, 2011.

(Continued)

*Primary Examiner* — Seahvosh Nikmanesh
*Assistant Examiner* — Evren Seven
(74) *Attorney, Agent, or Firm* — Anthony Canale; Roberts Mlotkowski Safran & Cole, P.C.

(57) ABSTRACT

Methods are provided for fine tuning substrate resistivity. The method includes measuring a resistivity of a substrate after an annealing process, and fine tuning a subsequent annealing process to achieve a target resistivity of the substrate. The fine tuning is based on the measured resistivity.

22 Claims, 9 Drawing Sheets

(56) References Cited

OTHER PUBLICATIONS

Doo et al. "Growing High Resistivity Epitaxial Films on Low Resistivity Silicon Substrates", Jul. 1, 1962, www.ip.com, 2 pages.
Goesele "Oxygen Diffusion and Thermal Donor Formation in Silicon", Appl. Phys. A 28,79-92 (1982), 14 pages.
Dekker et al. "Substrate Transfer for RF Technologies", IEEE Transactions on Electronic Devices, vol. 50, No. 3, 2003, pp. 747-757.
Nanver et al. "RF/Microwave Device Fabrication in Silicon-on-Glass Technology", International Conference on Microelectronics, Nov. 14, 2008, 8 pages.
International Search Report of International Searching Authority for Application No. PCT/US13/27264, date of mailing—Mar. 22, 2013, 3 pages.
Written Opinion of International Searching Authority for Application No. PCT/US13/27264, date of mailing—Mar. 22, 2013, 7 pages.

* cited by examiner

FINE TUNING HIGHLY RESISTIVE SUBSTRATE RESISTIVITY AND STRUCTURES THEREOF

FIELD OF THE INVENTION

The invention relates to semiconductor structures and, more particularly, to methods of fine tuning substrate resistivity and structures thereof.

BACKGROUND

Radio frequency (RF) devices suffer from parasitic losses due to coupling to the substrate. One approach to improve performance of such RF devices is to use highly resistive substrates, which are known to reduce parasitic capacitance and coupling to the substrate. The use of highly resistive substrates offers the advantages of better integration of passive devices, reduction of cross talk, as well as a reduction of power consumption through charging and discharging of unwanted capacitances.

However, to maintain stability in such highly resistive substrates, very low oxygen concentrations are required. That is, utilizing highly resistive silicon substrates requires strict specifications on oxygen concentration to prevent thermal donors from arising during back end low temperature anneals (e.g., 400° C.-600° C.). As is known, thermal donors can have unwanted/undesired effects on the integrated circuit (IC) performance such as increased depletion region (when counter-doping initial boron doping), and unintended doping. It is important to note that it is very difficult to reduce thermal donors once they arise in the back end annealing process because it requires high temperature annealing.

Wafers having highly resistive substrates, i.e., approximately 1,000 ohm-cm to 3,000 ohm-cm resistivity range, which meet strict oxygen specifications can be very expensive and difficult to control. As to the latter drawback, the various tight restrictions to doping and oxygen concentration are required to ensure that few oxygen donors are activated during the many anneal steps during back of the line processes. Also, highly resistive substrates provided directly from a manufacture may have quality control issues; that is, there is no guarantee that a manufacturer can provide the required substrate resistivity, on a consistent basis. Also, using such wafers will limit back end anneals which may affect the number of back end metal levels offered by the technology.

To solve the above problems, it is known to build integrated circuits (IC) on silicon on insulator (SOI) wafers. However, SOI wafers are also expensive and they may exhibit defect density, etc., when compared to bulk Si substrates. As an alternative approach, it is possible to transfer fully processed wafers onto alternative substrates such as glass, AlN, alumina, ferrite, PCB, etc. However, this also is an expensive process, adding to both fabrication complexity and time.

Accordingly, there exists a need in the art to overcome the deficiencies and limitations described hereinabove.

BRIEF SUMMARY

In an aspect of the invention, a method comprises measuring a resistivity of a substrate after an annealing process, and fine tuning a subsequent annealing process to achieve a target resistivity of the substrate. The fine tuning is based on the measured resistivity.

In an aspect of the invention, a method comprises obtaining a starting resistivity of a substrate. The method further comprises depositing subsequent metallization layers on the substrate using annealing processes. The method further comprises, after a final metallization layer, measuring a resistivity of the substrate. The method further comprises adjusting a final anneal process based on the starting resistivity and measured resistivity, to meet a target resistivity.

In an aspect of the invention, a method comprises determining a target resistivity of a substrate after a final annealing process. The method further comprises determining how many metallization layers are required for a particular build structure on the substrate. The method further comprises determining required anneal rates for each back end of the line (BEOL) process to obtain the target resistivity. The method further comprises measuring the resistivity of the substrate after each BEOL process. The method further comprises adjusting the anneal rates to achieve the target resistivity, based on the measured resistivity.

In another aspect of the invention, the method comprises providing a substrate having a first resistivity value. The method further comprises forming structures upon the substrate through annealing processes. The annealing processes changes the first resistivity value to a second resistivity value. The method further comprises modifying a dopant concentration in the substrate to change the second resistivity value to a target resistivity value through BEOL annealing processes.

In yet another aspect of the invention, a computer program product is provided which comprises a computer usable tangible storage medium having readable program code embodied in the storage medium which can be read by a computer. The computer program product includes at least one component operable to: receive a base line resistivity of a substrate; measured resistivity values of the substrate after annealing processes; and extrapolate a final anneal rate for the substrate to achieve a target resistivity of the substrate, based on the base line resistivity, at least a last measured resistivity value and a known anneal time and temperature.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the highly resistive substrate which comprises the structures of the present invention. In still further embodiments, a method in a computer-aided design system is provided for generating a functional design model of the highly resistive substrate. The method comprises generating a functional representation of the structural elements of the highly resistive substrate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to methods of fine tuning substrate resistivity and structures thereof. More specifically, the present invention allows the fabrication process to use a low substrate resistivity material with higher or normal oxygen concentrations and then, using thermal donor generation annealing to increase the resistivity of the substrate during BEOL annealing processes. In embodiments, for example, the present invention can achieve a desired substrate resistivity and, hence an acceptable oxygen concentration in the substrate to improve substrate performance, by extending back end anneal times in a very controlled manner. This can be accomplished, in embodiments, by measuring substrate resistivity during back end of the anneal processes, i.e., prior to and post first metallization (M1) and, based on these measurements, making adjustments to subsequent annealing processes to achieve a desired substrate resistivity with low oxygen concentrations.

In more specific embodiments, the present invention comprises providing a substrate with a first resistivity value (e.g., less than 1,000 ohm-cm), and forming structures (active or passive devices) on the substrate. The processes to form the structures changes the substrate resistivity to a second resistivity value due to the annealing processes. The method further comprises modifying a dopant concentration in the substrate (e.g., oxygen concentration) during subsequent BEOL annealing processes in a controllable manner using extrapolations of relationships between annealing rates and oxygen concentrations. This, in turn, will change the substrate resistivity to a third (target) resistivity value.

Advantageously, it is now possible to use a conventional silicon wafer with a standard oxygen concentration of about $5 \times 10^{17}$ to $2 \times 10^{18}$ parts per million atoms (ppma). This, in turn, reduces overall fabrication costs, and improves overall quality control issues (compared to conventional techniques). Also, using the aspects of the present invention, it is now possible to provide as many back end anneals as required, without affecting performance issues, i.e., without increasing oxygen concentrations to an unacceptable level (few oxygen donors are activated during the many BEOL anneal processes).

Figure 1:
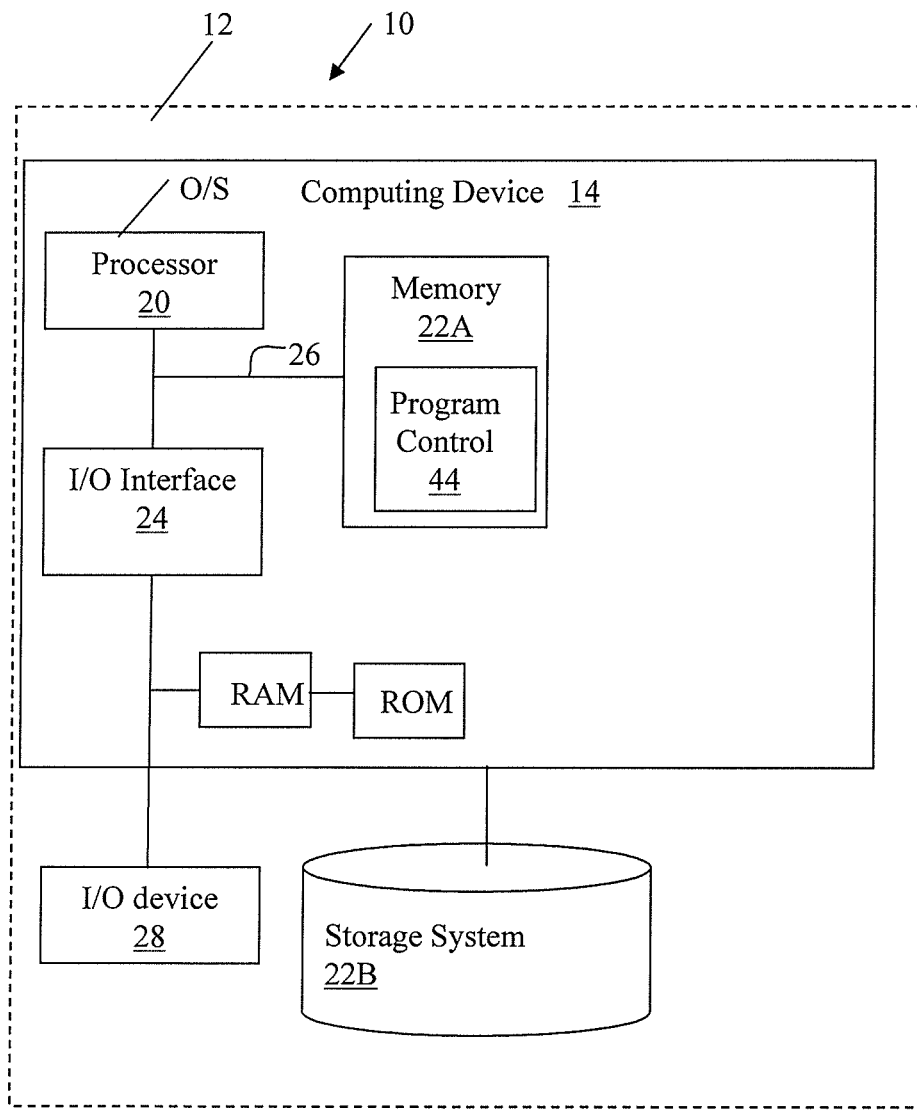
FIG. 1 is an illustrative environment for implementing the steps in accordance with aspects of the invention.

FIG. 1 is an illustrative environment for implementing the steps in accordance with aspects of the invention. As should be understood by those of skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system", as representatively shown in FIG. 1. Furthermore, aspects of the present invention may take the form of a computer program product embodied in one or more computer readable medium(s) having computer readable program code embodied thereon.

More specifically, FIG. 1 shows an illustrative environment 10 for managing the processes in accordance with the invention. To this extent, the environment 10 includes a server or other computing system 12 that can perform the processes described herein. In particular, the server 12 includes a computing device 14, which can be resident on a network infrastructure or computing device of a third party service provider (any of which is generally represented in FIG. 1). The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. In accordance with aspects of the invention, the program control 44 performs one or more of the processes described herein. For example, the program control 44 can adjust processes to provide a target substrate resistivity and, hence an acceptable oxygen concentration in the substrate thereby improving substrate performance. In embodiments, for example, the program control 44 can extrapolate discovered correlations between annealing data and resistivity values, oxygen concentration values and dependencies thereof in order to extend back end anneal times in a very controlled manner, to achieve the target substrate resistivity. Even more specifically, in embodiments, the program control 44 can use substrate resistivity measurements during back end of the anneal processes, i.e., prior to and post first metallization (M1) and, based on these measurements, make adjustments to subsequent annealing processes to achieve a desired substrate resistivity with low oxygen concentrations.

The program control 44 can be implemented as one or more program code in the program control 44 stored in memory 22A as separate or combined modules. Additionally, the program control 44 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in the computing device 14.

It is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiments, the program code can be implemented on any combination of one or more computer readable medium(s) may be utilized. The computer readable medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

The computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the processes described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
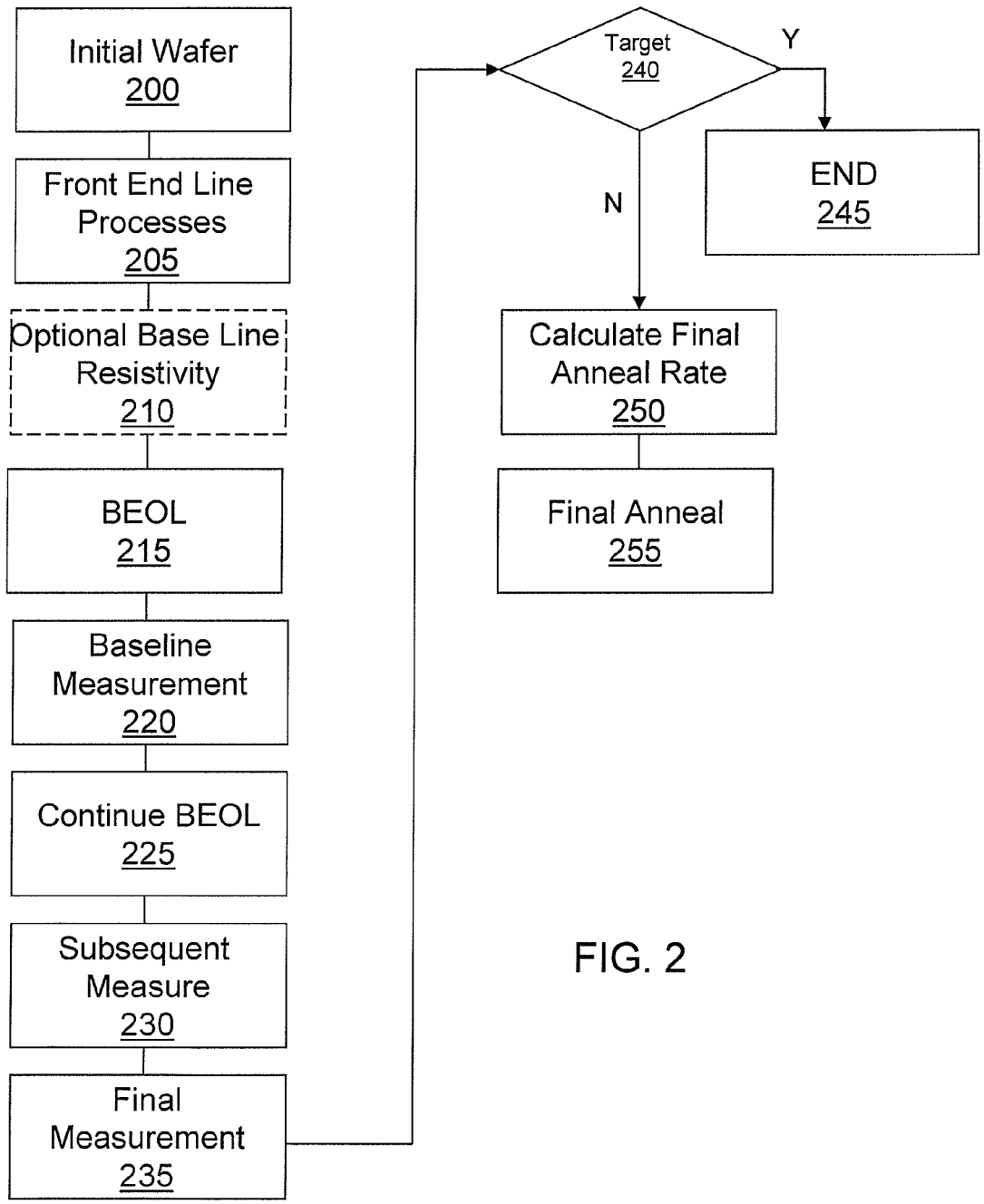
FIGS. 2 and 3 show exemplary flows for performing processes in accordance with aspects of the present invention.
Figure 3:
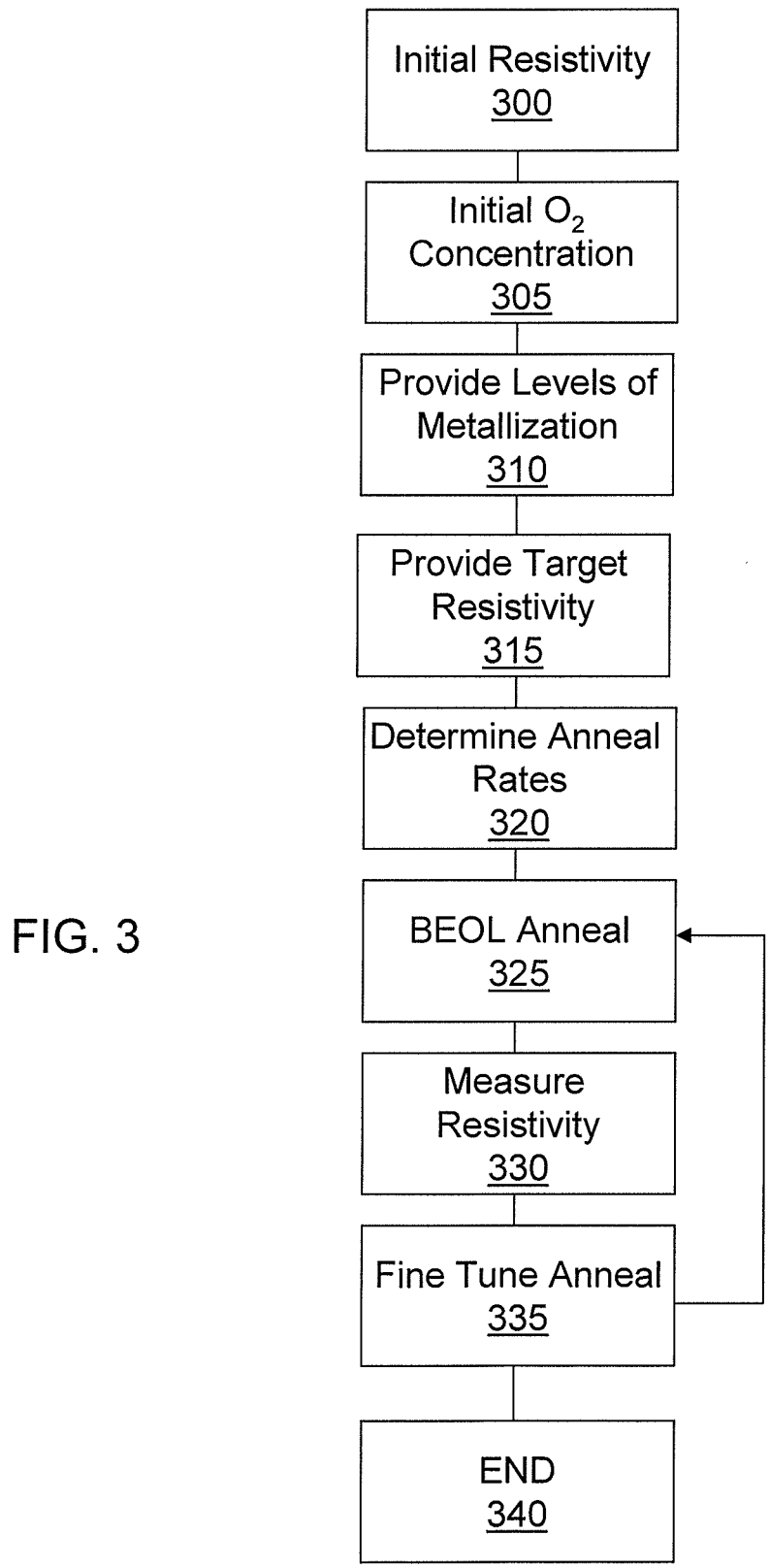

FIGS. 2 and 3 show exemplary flows for performing processes in accordance with aspects of the present invention. The steps of FIGS. 2 and 3 may be implemented in the environment of FIG. 1, for example. The flowcharts in the Figures illustrate the architecture, functionality, and operation of possible implementations of systems, methods and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustrations, can be implemented by special purpose hardware-based systems that perform the specified functions or acts, or combinations of special purpose hardware and computer instructions, as representatively shown, for example, in FIG. 1.

More specifically, FIG. 2 shows a flow diagram to achieve a target substrate resistivity (and hence acceptable oxygen concentration), in accordance with aspects of the present invention. At step 200, an initial silicon wafer is provided by a manufacturer, with a known resistivity and known oxygen concentration. In embodiments, the initial resistivity of the substrate may be measured, using known tools. For example, and as should be understood by those of skill in the art, the substrate resistivity can be measured at any metallization layer by a number of techniques including, but not limited to, C-V measurements, measuring the series resistance of a diode structure, or transmission line measurements, as some examples. At step 205, front end of the line processes are performed such as, for example, the fabrication of active and passive devices. In optional embodiments, at step 210, a base line resistivity can be measured (provided) after the front end of the line processes are performed.

At step 215, BEOL processes (BEOL) begin, e.g., a first metallization layer and contacts formed on the structure. At step 220, after the deposition of the contacts and a first metallization layer, a starting resistivity of the substrate is obtained by measuring (test) and confirming the substrate resistivity. At step 225, the BEOL processes continue, by depositing subsequent metallization layers using annealing processes. At step 230, after the annealing process for the deposition of the subsequent metallization layers is complete, another measurement is taken to measure the substrate resistivity and to determine any changes. Step 225 to step 230 can be repeated for each subsequent metallization layer. At step 235, after the deposition of the final metallization layer, the final substrate resistivity is measured (and recorded).

At step 240, a determination is made as to whether the final substrate resistivity is at the target substrate resistivity. If the final substrate resistivity is at the target resistivity, the process ends at step 245. If the final substrate resistivity is less than the target substrate resistivity, at step 250, an extrapolation calculation is performed in order to determine a final anneal rate for the wafer to achieve the target substrate resistivity (and hence acceptable oxygen concentration). At step 255, a final anneal is provided, at the recommended anneal rate to achieve the target substrate resistivity. As described herein, the extrapolation calculation is based on relationships discovered between changes in resistivity and oxygen concentrations at known annealing temperatures for known time periods, with a substrate of a known initial resistivity. In an alternative approach, the final substrate resistivity can be found through modeling as described herein.

FIG. 3 shows an alternative flow diagram to determine annealing rates to achieve a final substrate resistivity, in accordance with aspects of the present invention. At step 300, an initial resistivity of the substrate is recorded/provided. In embodiments, the initial resistivity of the substrate can be, for example, measured by any conventional ohmmeter. Alternatively, the resistivity of the substrate can be provided by a manufacturer of the substrate. At step 305, in an optional step, the initial oxygen concentration of the substrate can be obtained, e.g., provided/recorded. In embodiments, the initial oxygen concentration can be measured by using known tools. Alternatively, the initial oxygen concentration can be provided by the manufacturer.

At step 310, a determination is made as to how many metallization layers are required for a particular build structure. At step 315, the target resistivity of the substrate is also determined/recorded. For example, the final resistivity of the substrate can be based on many different factors such as, for example, the desired parasitic capacitance and/or coupling to the substrate. At step 320, the required anneal rates for each BEOL process, e.g., anneal times and temperatures, are determined for each metallization layer based on the input of steps 305-315. In embodiments, as discussed herein, the anneal rates can be provided through a correlation found between changes in resistivity and oxygen concentrations for substrates with a known initial resistivity, which are annealed at known temperatures for known time periods.

At step 325, annealing of the back end devices can begin using the anneal rates determined at step 320. After annealing each or any combination of the one or more metallization layers, at step 330, the resistivity of the structure can again be measured and, in embodiments, recorded. As described above, the substrate resistivity can be measured at any metallization layer by a number of techniques including, but not limited to, C-V measurements, measuring the series resistance of a diode structure, or transmission line measurements, as some examples.

At step 335, fine tuning of the anneal rates can be provided at each annealing steps or combination thereof. In embodiments, the fine tuning of the anneal rates is based on the measured resistivity and its known correlations to anneal rates, oxygen concentrations, etc., to achieve the target substrate resistivity. At step 340, the process ends with a final anneal at a determined anneal rate, to achieve the target resistivity.

As described herein, the fine tuning of the anneal rates to achieve the target substrate resistivity can be provided by a series of extrapolations or known empirical relations at each anneal step or combination of anneal steps. These extrapolations are based on the derived correlation between the resistivity and oxygen concentrations at known temperatures for known time periods, amongst other features described herein. In embodiments, for example, achieving the target substrate resistivity is provided by extending back end anneal times prior to or post first metallization (M1) during formation of different metallization layers (e.g., M1/M2 and last metallization (LM) layer).

FIGS. 4-8 show several graphs for implementing aspects of the present invention. As should be understood, the data and related correlations represented in these graphs were discovered after extensive experimentation, which can now be used to implement aspects of the present invention. For example, the data and related correlations can be used as models (e.g., known empirical relations) for determining anneal rates needed to achieve a target substrate resistivity over one or more annealing processes, as described with reference to FIGS. 2 and 3. Similarly, the data shown in FIGS. 4-8 can be extrapolated, using the infrastructure shown in FIG. 1 or on any number of different computer program products, to fine tune the resistivity of the substrate through a series of annealing/in-line tests, as described with reference to FIGS. 2 and 3. In this way, it is now possible to use a conventional silicon wafer, with a standard oxygen concentration of about $5 \times 10^{17}$ to $2 \times 10^{18}$, and using one or more back end annealing processes to achieve a target substrate resistivity with low oxygen concentrations, i.e., without increasing oxygen concentrations to an unacceptable level.

Figure 4:
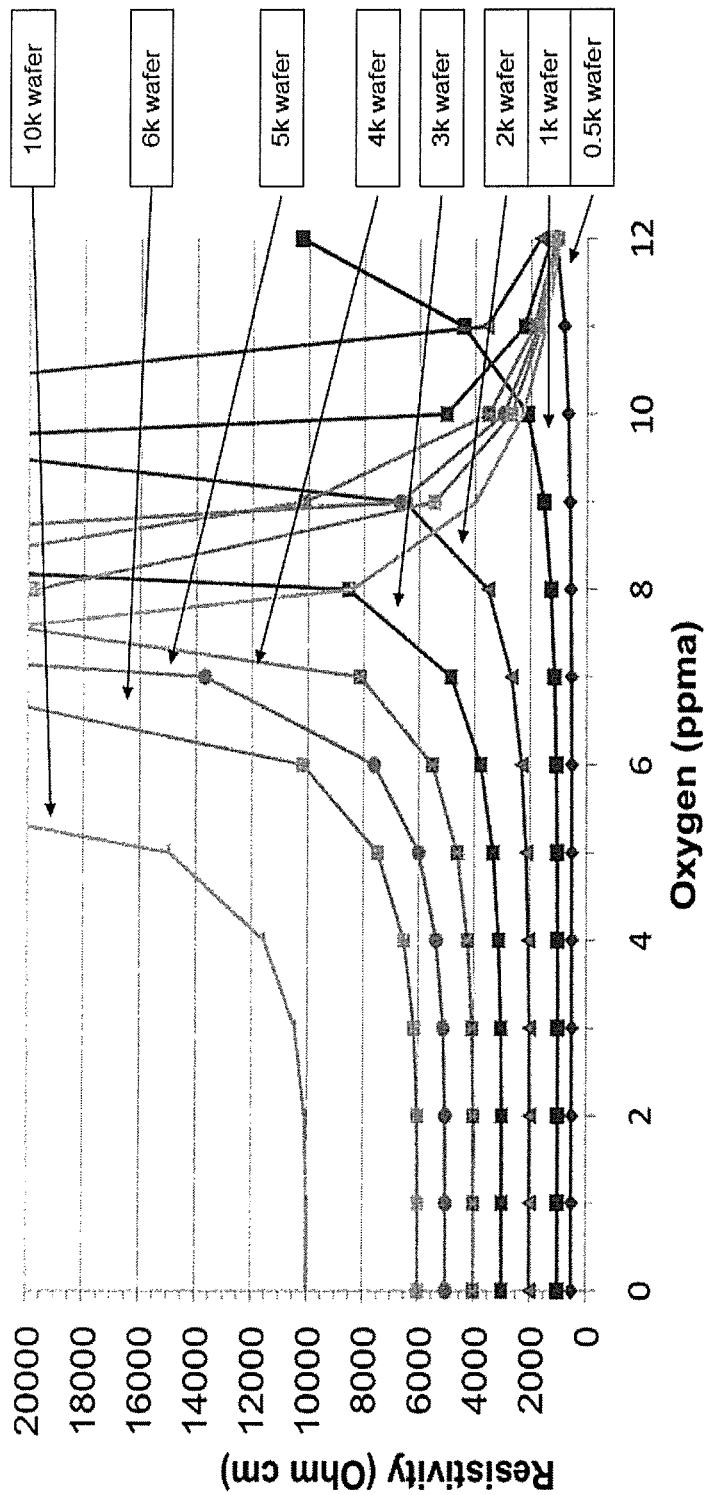
FIG. 4 shows a graph of correlations between resistivity and oxygen concentration of eight wafers, using an annealing process of about 2 hours at about 450° C.

More specifically, FIG. 4 shows a graph of correlations between resistivity and oxygen concentration of eight wafers, using an annealing process of about 2 hours at about 450° C. In FIG. 4, the y-axis represents a change in resistivity (ohm-cm), and the x-axis shows a change in oxygen concentration (parts per million atoms (ppma)). As shown in FIG. 4, the correlation of resistivity and oxygen concentration are provided for eight wafers with the following starting resistivity:
  (i) 0.5 k (500 ohms-cm) wafer;
  (ii) 1 k wafer;
  (iii) 2 k wafer;
  (iv) 3 k wafer;
  (v) 4 k wafer;
  (vi) 5 k wafer;
  (v) 6 k wafer; and
  (iv) 10 k wafer.

As seen in the graph of FIG. 4, through in series testing, it has been found that oxygen concentration of the substrate increases as the resistivity increases over anneal time. For example, the resistivity of the 10 k wafer over an anneal time of 2 hours at 450° C. will increase to 20,000 ohm-cm, with a corresponding increase in oxygen concentration. In a further example, the resistivity of the 0.5 k wafer with 12 ppma oxygen concentration will remain relatively stable, e.g., increases to about 600 ohm-cm. Accordingly, by knowing these relationships, it is now possible to achieve a target substrate resistivity, after performing certain BEOL annealing processes. In this way, it is possible to fine tune the annealing processes to achieve the desired structure, e.g., final resistivity and oxygen donor concentration, by extrapolating the final resistivity of FIG. 4 based on wafers having different initial resistivities with different oxygen concentrations.

Figure 5:
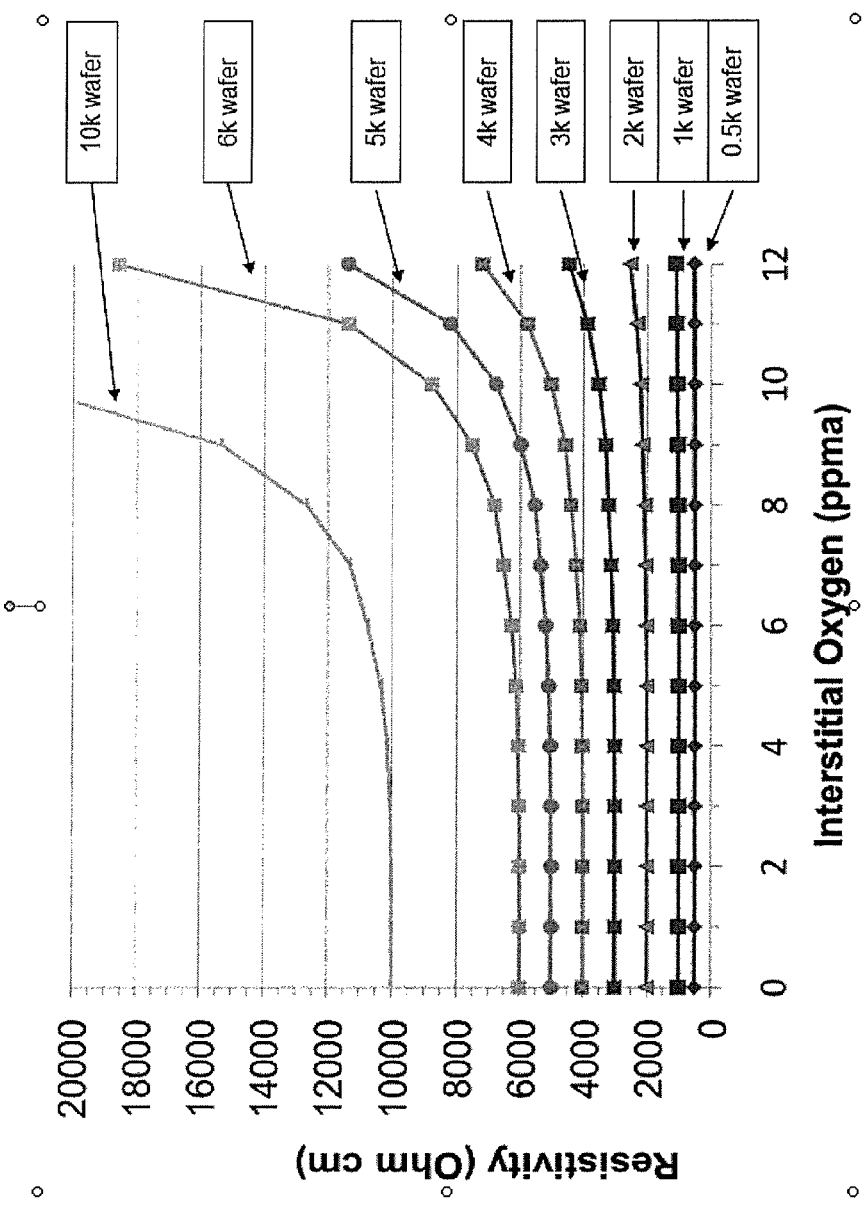
FIG. 5 shows a graph of correlations between resistivity and oxygen concentration of eight wafers, using an annealing process of about 2 hours at about 400° C.

FIG. 5 shows a graph of correlations between resistivity and oxygen concentration of eight wafers, using an annealing process of about 2 hours at about 400° C. In FIG. 5, the y-axis represents a change in resistivity (ohm-cm), and the x-axis shows a change in oxygen concentration (parts per million atoms (ppma)). As shown in FIG. 5, the correlations of resistivity and oxygen concentration are provided for eight wafers with the same starting resistivity as shown in FIG. 4.

As seen in the graph of FIG. 5, it has been found that oxygen concentration of the substrate increases as the resistivity increases over anneal time, but at a different rate than shown in the graph of FIG. 4. That is, it has been found that the same wafers shown in FIG. 4 are less sensitive to changes at an annealing time of 2 hours at 400° C. versus an anneal time of 2 hours at 450° C. For example, the resistivity of the 10 k wafer over an anneal time of 2 hours at 450° C. will increase to 20,000 ohm-cm, with a corresponding oxygen concentration of about 5 ppma; whereas, in contrast, the resistivity of the 10 k wafer with identical oxygen concentration will increase to about 10,400 ohm-cm after a 2 hour 400° C. anneal. In this way, it is possible to fine tune the annealing processes to achieve the desired final resistivity, by extrapolating the results of FIG. 5 (and/or FIG. 4) from wafers having different initial resistivities, after different annealing processes.

Figure 6:
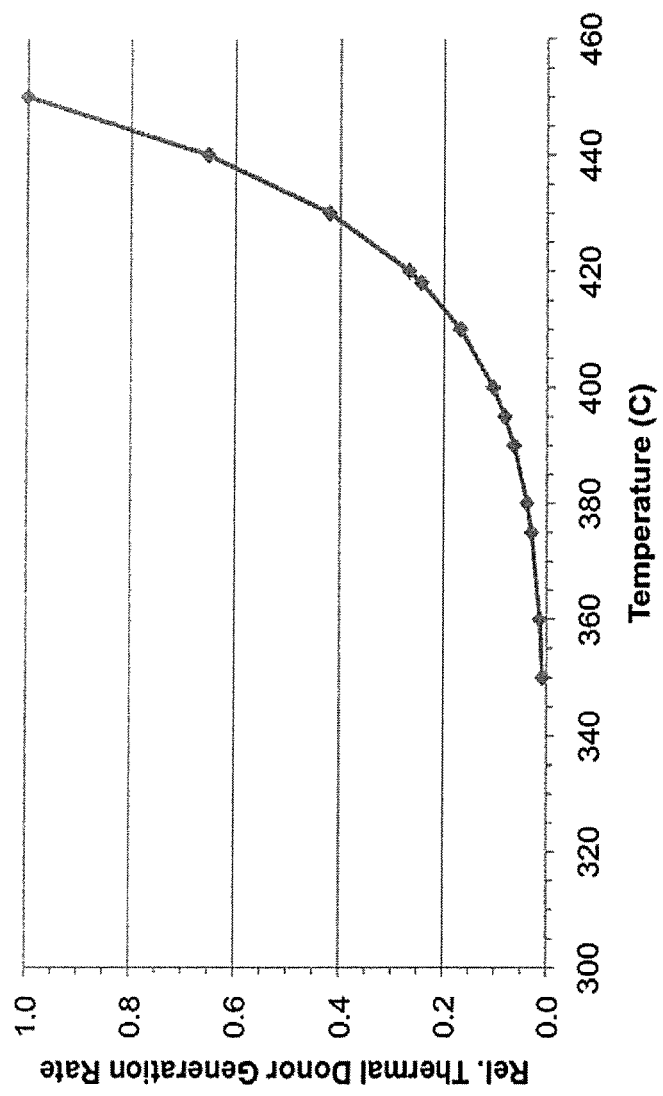
FIG. 6 shows a graph of time dependence of thermal donor generation in accordance with aspects of the invention.

FIG. 6 shows a graph of time dependence of thermal donor generation in accordance with aspects of the invention. In this graph, the y-axis represents a relative thermal donor generation rate, and the x-axis shows temperature in Celsius. As shown in FIG. 6, it has been found that generation of thermal donors significantly increases as temperature increases within the temperature range shown. For example, the relative thermal donor generation rate at about 350° C. is about 0; whereas, the relative thermal donor generation rate at about 430° C. is 0.4. Interesting, the relative thermal donor generation rate at about 450° C. is 1.0, which is more than twice (2x) the relative thermal donor generation rate at about 430° C. Thus, it has been found that the thermal donor generation rate is generated as a function of temperature, and increases significantly at higher temperatures for temperature ranges shown.

Figure 7:
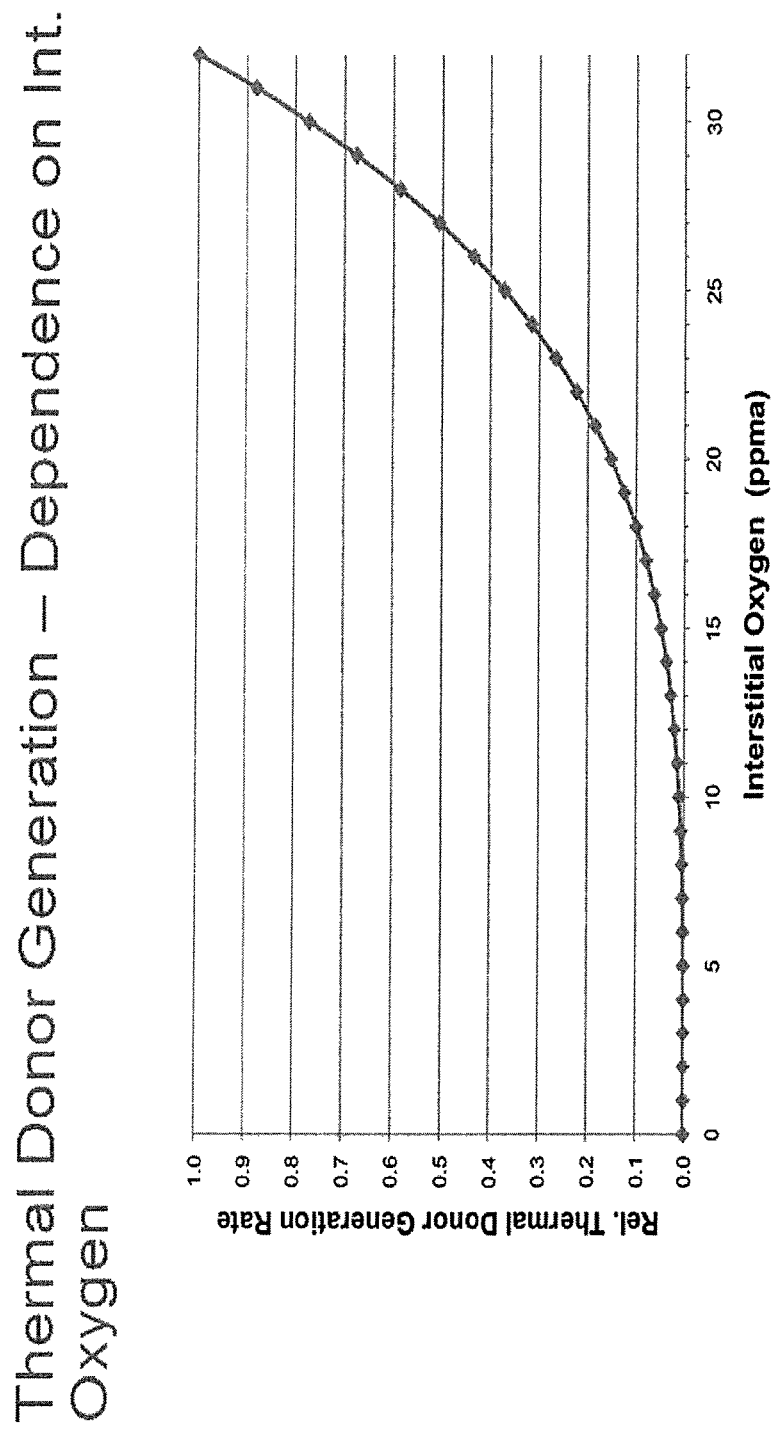
FIG. 7 shows a graph of thermal donor generation and its dependence on interstitial oxygen in accordance with aspects of the invention.

FIG. 7 shows a graph of thermal donor generation and its dependence on interstitial oxygen. In this graph, the y-axis represents relative thermal donor generation rate, and the x-axis represents interstitial oxygen in ppma. As seen from this graph, the relative thermal donor generation rate increases as a function of interstitial oxygen concentration. For example, at an interstitial oxygen concentration of 18 ppma, the relative thermal donor generation rate is 0.1.

As should be understood by those of skill in the art, the oxygen thermal donors contribute electrons to conduction which can, depending on the number of donors generated versus the background carrier concentration of the wafer, alter the resistivity of the wafer. For example, in p-type silicon, thermal donors increase the resistivity of the wafer until the thermal donor concentration exceeds the p-type carrier concentration, at which point the wafer will appear to be n-type.

Figure 8:
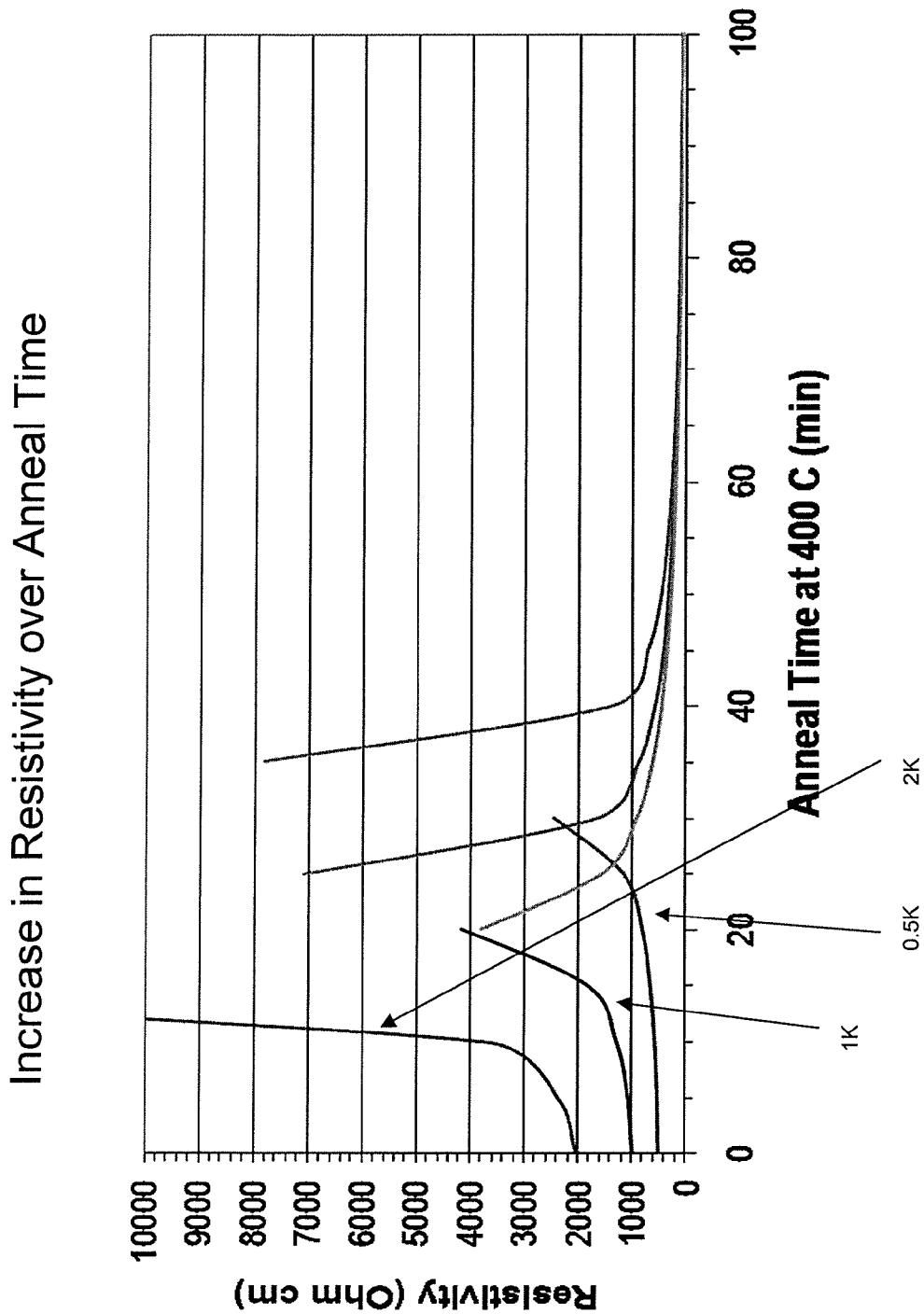
FIG. 8 shows a graph of thermal donor effects for a standard (high oxygen) substrate material.

FIG. 8 shows a graph of thermal donor effects for a standard (high oxygen) substrate material. In embodiments, the oxygen content of the standard substrate material is, for example, about $5 \times 10^{17}$-$2 \times 10^{18}$ ppma. In FIG. 8, the y-axis represents resistivity in ohm-cm, and the x-axis represents time, as measured in minutes. The graph of FIG. 8 shows the correlation of the resistivity over time, during an anneal at 400° C. The graph further shows three substrates with an initial resistivity of 500 ohm-cm, 1,000 (1 k) ohm-cm and 2,000 (2 k) ohm-cm. As shown in this graph, resistivity of each of the wafers increases over time, with the most significant increase being the 2 k wafer.

Accordingly, by knowing the relationships shown in the graphs of FIGS. 4-8, it is now possible to achieve a target substrate resistivity and, as importantly, a certain oxygen concentration. This can be done by fine tuning the BEOL annealing processes to achieve the target substrate resistivity and oxygen concentration by, for example, extrapolating the results of FIGS. 4-8 to different wafers having different resistivities, after different annealing processes.

By way of a non-limiting illustrative example, a substrate can have an initial substrate resistivity within a range of 0.5 k to approximately 1.5 k (500 ohm-cm to 1,500 ohm-cm). Back end annealing temperatures can be about 400° C. to 450° C., and the beginning oxygen concentration of the substrate can be about $5 \times 10^{17}$-$2 \times 10^{18}$ ppma. The thermal donor formation rate can be $C_{TD}^*$, which represents the maximum thermal donor concentration, as represented below.

$$dc_{TD}/dt = k_{gen}(c^*_{TD} - c_{TD}),$$

If the thermal donor formation is overshot at any of the annealing processes, thermal correction can be achieved by changing the temperature using the following equation:

$$dc_{TD}/dt = -k_{dec}[c_{TD} - c^*_{TD}(T_2)].$$

where $K_{gen}$ and $k_{dec}$ can be derived through experiments. (See, i.e., U. Gosele and T. Y. Tan, Appl. Phys. A 28, 79-92 (1982).) These processes can be performed on the infrastructure shown in FIG. 1, or on any computer program product as described herein.

Figure 9:
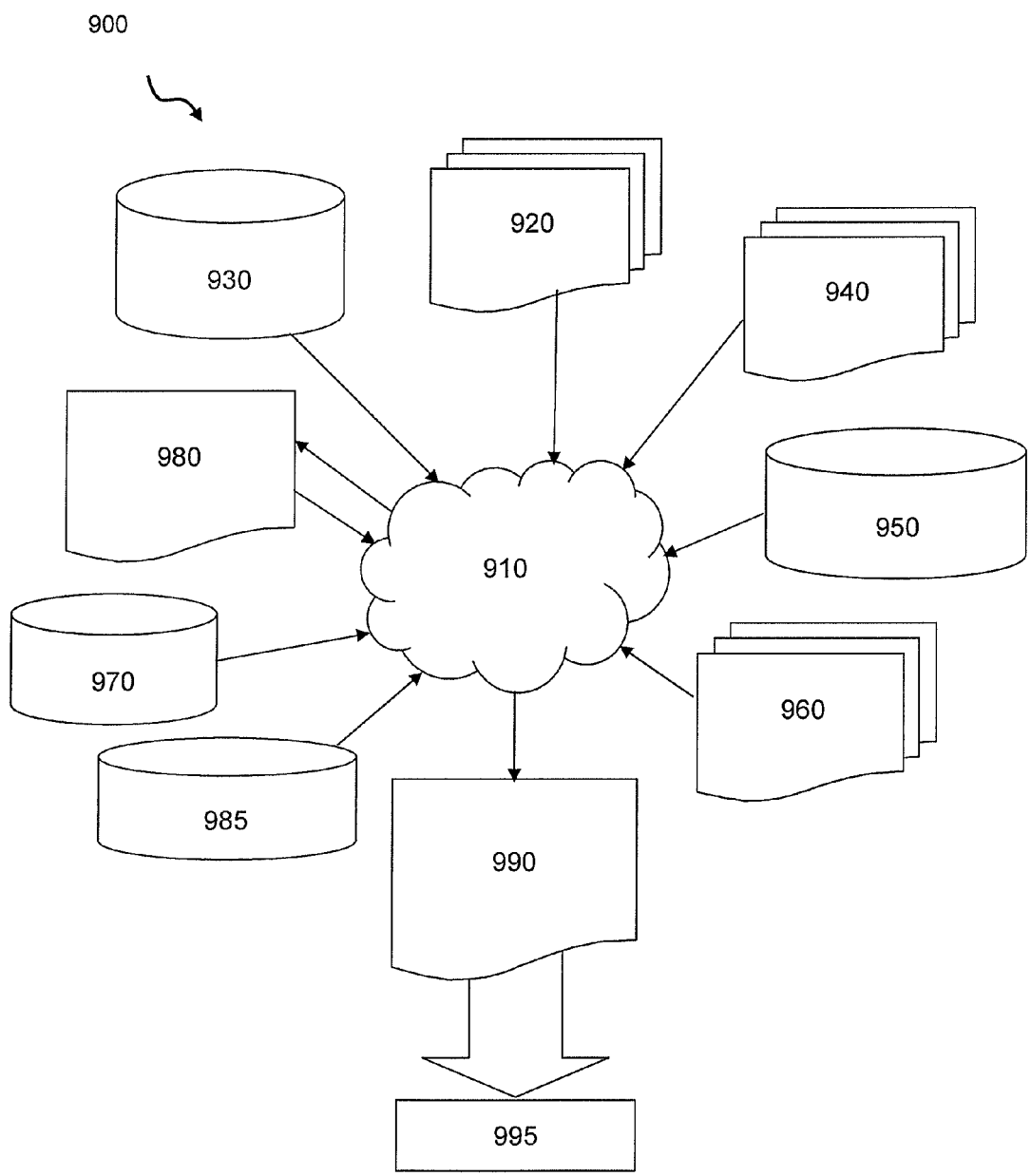
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown. In one embodiment, design structure 990 may comprise a compiled, executable HDL simulation model that functionally simulates the devices described herein.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
performing back end of the line (BEOL) processes on a substrate;
measuring a first resistivity of the substrate after performing an annealing process of the BEOL processes;
continuing to perform the BEOL processes on the substrate after the measuring the first resistivity;
measuring a second resistivity of the substrate after performing a subsequent annealing process of the continued BEOL processes;
determining whether the second resistivity of the substrate is at a target resistivity; and
when the second resistivity is not at the target resistivity, fine tuning a final annealing process to achieve the target resistivity by extrapolating correlation data of historical substrates with known resistivities after annealing processes to a resistivity change between the first resistivity and the second resistivity.

2. The method of claim 1, wherein the measuring the first resistivity is provided after completion of an initial BEOL process comprising a metallization layer process.

3. The method of claim 2, wherein the fine tuning comprises adjusting the final annealing process of the substrate to a predetermined temperature and time to achieve the target resistivity.

4. The method of claim 3, wherein the correlation data further comprises oxygen concentrations at a known anneal temperature and time.

5. The method of claim 1, further comprising adjusting anneal rates for one or more metallization layer processes based on the target resistivity of the substrate and an amount of metallization layers required for a structure.

6. The method of claim 5, wherein the fine tuning comprises adjusting an annealing temperature after completion of a final metallization layer.

7. The method of claim 5, wherein the fine tuning comprises adjusting an annealing temperature based on the second resistivity of the substrate after any of the one or more of metallization layer processes.

8. The method of claim 7, wherein the fine tuning comprises providing the final annealing process at a predetermined temperature and time based on the correlation data.

9. The method of claim 8, wherein the correlation data further comprises oxygen concentrations at a known anneal temperature and time for several different resistances.

10. The method of claim 7, wherein the fine tuning comprises adjusting the annealing rates based on a measured resistivity of the substrate after each of the metallization layer processes.

11. A method comprising:
obtaining a initial resistivity of a substrate;
performing back end of the line (BEOL) processes on the substrate after obtaining the initial resistivity, wherein the performing the BEOL processes comprises depositing metallization layers on the substrate using annealing processes;
after a first metallization layer is deposited on the substrate, measuring a starting resistivity of the substrate;
after a second metallization layer is deposited on the substrate, measuring a subsequent resistivity of the substrate; and
adjusting a final anneal process of the substrate to a predetermined temperature and time to achieve a target resistivity by extrapolating correlation data of historical substrates with known resistivities after annealing processes to a resistivity change between the initial resistivity, the starting resistivity, and the subsequent resistivity.

12. The method of claim 11, further comprising obtaining a base line resistivity after the front end of the line processes are performed on the substrate.

13. The method of claim 11, wherein the starting resistivity is obtained after an initial BEOL processes on the substrate.

14. The method of claim 13, wherein the initial BEOL processes includes the deposition of the first metallization layer and a contact.

15. The method of claim 14, further comprising obtaining substrate resistivity measurements after each BEOL annealing process.

16. The method of claim 15, wherein the adjusting of the final anneal process is performed after a final metallization layer is deposited on the substrate.

17. The method of claim 15, wherein the extrapolated correlation data further comprises known anneal temperatures and times for the annealing processes of the metallization layers.

18. A method comprising:
determining a target resistivity of a substrate after a final annealing process;
determining how many metallization layers are required for a particular build structure on the substrate;
determining required anneal rates for each back end of the line (BEOL) process that is used for processing each of the determined metallization layers to obtain the target resistivity;
annealing each of the determined metallization layers using the determined anneal rates;
measuring the resistivity of the substrate after each annealing of the determined metallization layers or after annealing any combination of the determined metallization layers; and
adjusting the anneal rates after the annealing of each or any combination of the determined metallization layers to achieve the target resistivity,
wherein the required anneal rates and adjusted anneal rates are determined by extrapolating correlation data of historical substrates with known resistivities after annealing processes to a resistivity change between an initial resistivity of the substrate and the measured resistivity of the substrate.

19. The method of claim 18, further comprising obtaining a starting resistivity of the substrate after a first metallization layer process, wherein the adjusting is based on the initial resistivity, the measured resistivity, and the starting resistivity.

20. A method comprising:
providing a substrate having a first resistivity value;
forming structures upon the substrate through annealing processes;
obtain a base line resistivity value of the substrate after the annealing processes;
performing back end of the line (BEOL) processes on the substrate after the obtaining of the baseline resistivity, wherein the BEOL process comprise subsequent annealing processes that change the base line resistivity value of the substrate to a first resistivity value;
measuring the first resistivity value of the substrate after performing a first subsequent annealing process of the BEOL processes;
continuing to perform the BEOL processes on the substrate after the measuring the first resistivity value;
measuring a second resistivity value of the substrate after performing a second subsequent annealing process of the continued BEOL processes;
determining whether the second resistivity value of the substrate is at a target resistivity value; and
when the second resistivity value is not at the target resistivity, modifying a dopant concentration in the substrate to change the second resistivity value to the target resistivity value through BEOL annealing processes,
wherein the modifying is performed by extrapolating correlation data of historical substrates with known resistivities after annealing processes to a resistivity change between the first resistivity value, the base line resistivity value, the first resistivity value, and the second resistivity value.

21. The method of claim 20, wherein the modifying the dopant concentration comprises an oxygen content.

22. A computer program product comprising a computer usable tangible storage medium having readable program code embodied in the storage medium which can be read by a computer, the computer program product includes at least one component operable to:
receive a base line resistivity of a substrate;
measure a first resistivity of the substrate after a first annealing process of back end of line (BEOL) processes is performed on the substrate;
measure a second resistivity of the substrate after a second annealing process of BEOL processes is performed on the substrate;
determining whether the second resistivity of the substrate is at a target resistivity; and
when the second resistivity is not at the target resistivity, extrapolate a final anneal rate for the substrate to achieve the target resistivity of the substrate,
wherein the extrapolating is performed by extrapolating correlation data of historical substrates with known resistivities, anneal times, and temperatures after annealing processes to a resistivity change between the base line resistivity, the first resistivity, and the second resistivity.

* * * * *